Dec. 11, 1956 R. C. OELER 2,773,390
PLURAL TUNER DRIVE
Filed July 14, 1953
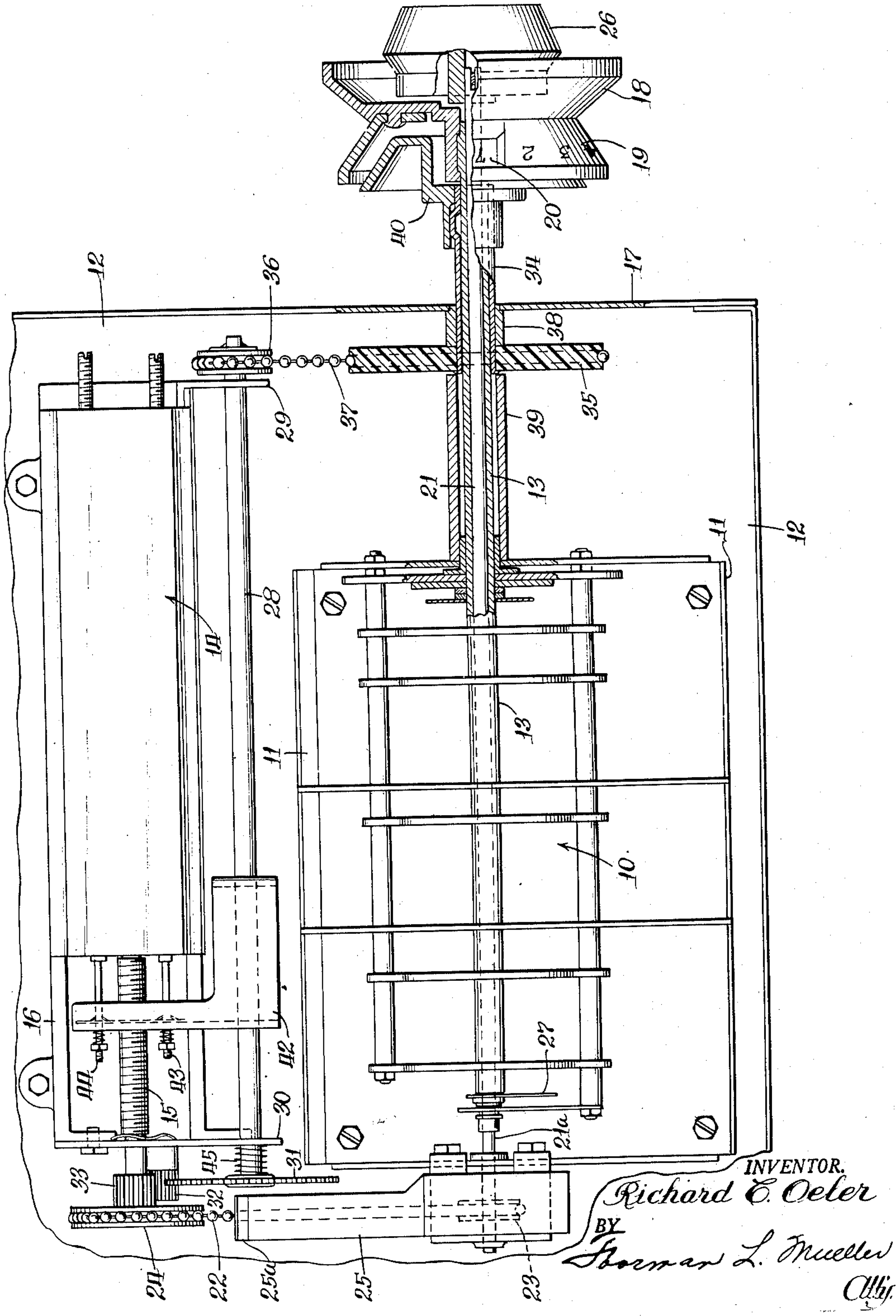
INVENTOR.
Richard C. Oeler
BY
Norman L. Mueller
Atty.

United States Patent Office 2,773,390

Patented Dec. 11, 1956

2,773,390

PLURAL TUNER DRIVE

Richard C. Oeler, Elmhurst, Ill., assignor to Motorola, Inc., Chicago, Ill., a corporation of Illinois Application July 14, 1953, Serial No. 367,952

10 Claims. (Cl. 74—10.45)

The present invention relates to tuner assemblies and more particularly to an improved tuner arrangement that may be utilized, for example, in a television receiver to provide a convenient means for tuning the television receiver through the very high and ultra high frequency bands.

Present-day television channels are located largely in what is termed the "very high frequency band," and it is usual to provide in each television receiver a tuning unit for selectively tuning the receiver to the various television signal channels within that band. In recent years, increased activity in the television industry has created the need for additional facilities for television channels and, for this reason, the Federal Communications Commission has allocated a higher frequency band (which has been termed the "ultra high frequency" band) for television usage.

The allocation of the ultra high frequency band has created problems in providing a television receiver that may be tuned through both the very high and ultra high frequency bands without undue manual switching or other adjusting operations, and by means of tuner units that may be arranged and driven without utilizing an undue amount of space in the television receiver.

It is an object of the present invention to provide an improved tuner assembly that includes a tuning unit for the very high frequency band and a tuning unit for the ultra high frequency band, and which also includes an improved actuating mechanism whereby these tuning units may be operated in a novel, convenient and improved manner.

Another object of the invention is to provide such an improved tuning assembly by means of which the aforementioned tuning units may be operated with a minimum of actuating components requiring a minimum of space in the television receiver.

Yet another object of the invention is to provide such an improved tuning assembly whereby the various channels in the very high and ultra high frequency bands are indicated in an improved manner and by means of a simplified and compact mechanism.

A feature of the present invention is the provision of an improved tuner assembly which includes first and second tuning units, and which also includes an auxiliary drive shaft mounted coaxially within the main drive shaft of the first unit, the auxiliary drive shaft being coupled to the main drive shaft of the second unit by means of a chain drive or the like.

Another feature of the invention is the provision of such an improved assembly in which an actuator knob for the first unit is affixed to the main drive shaft thereof, and an actuator knob for the second unit is affixed to the auxiliary drive shaft in nested relation with the first actuator knob.

A further feature of the invention is the provision of such an improved tuning assembly in which the actuator knob for the first tuning unit includes an annular calibrated indicator portion having a viewing section, and in which an indicator knob for the second unit is nested within the indicator portion of the first actuator knob and has calibrations viewable through the viewing section of the indicator portion of the first knob.

Yet another feature of the invention is the provision of such an improved assembly in which the indicator knob for the second tuning unit is driven by an indicator drive shaft mounted coaxially on the main drive shaft of the first unit and coupled to the second unit by a chain drive or the like.

Still another feature of the invention is the provision of such an improved tuning assembly in which the auxiliary drive shaft previously referred to is also used to provide a fine tuning adjustment for the first tuning unit when the second unit is not in use.

The above and other features of the invention which are believed to be new are set forth with particularity in the appended claims. The invention itself, however, together with further objects and advantages thereof, may best be understood by reference to the following description when taken in conjunction with the accompanying drawing in which:

The single figure shows the improved tuning assembly of the present invention.

Referring now to the drawing, the arrangement illustrated therein includes a first tuning unit 10 mounted on a suitable housing 11 which, in turn is supported on a chassis 12 of a television receiver. The tuning unit 10 may be any well known type of very high frequency television tuner such as a turret type, a rotary switch type, or the like. Tuning unit 10 includes a main shaft 13 which is rotatably mounted on housing 11 and which actuates movable contacts in the tuner in well known manner to tune the television receiver through the very high frequency band. Unit 10 is usually provided with a detent arrangement so that the receiver may be tuned selectively to the various signal channels in this band.

The assembly also includes a second tuning unit 14 which is mounted adjacent to unit 10 and which may be any well known continuous type tuner for tuning the television receiver to various signal channels in the ultra high frequency band. Tuning unit 14 includes a main tuning shaft 15 which extends in spaced parallel relation to the main tuning shaft 13 of tuning unit 10 and which is rotatable to vary the characteristics of tuning unit 14 and continuously tune the television receiver through the ultra-high frequency band. Tuning unit 14 is mounted in a suitable housing 16 which is also supported on the chassis 12 of the television receiver.

The main tuning shaft 13 of tuning unit 10 extends beyond the front portion 17 of chassis 12 and has an actuator knob 18 affixed thereto. The actuator knob has an annular calibrated indicator portion 19 attached thereto. The actuator knob and its indicator portion may conveniently be formed of a suitable plastic with the indicator portion being preferably translucent. Indicator portion 19 has a viewing section in the form of an aperture 20 formed therein which extends through the indicator portion and which is used for reasons to be described.

An auxiliary drive shaft 21 is rotatably mounted within main drive shaft 13 and has a portion **21*a* extending beyond the back of the tuning unit 10. The portion 21*a* of the auxiliary drive shaft is coupled to the main drive shaft 15 of tuning unit 14. This is achieved by the provision of a sprocket wheel 23 frictionally mounted on the portion 21*a* of shaft 21 and a second sprocket wheel 24 affixed to the main drive shaft 15, the sprocket wheels being mechanically coupled by a bead chain drive 22. A slip clutch arrangement is formed by the sprocket 23 and portion 21*a* of shaft so that rotation of shaft 21** beyond the end of travel of shaft 15 will not result in damage to the assembly. The sprocket wheels have a selected diameter ratio so that rotation of auxiliary drive shaft 21 rotates main drive shaft 15 at a reduced speed relative thereto, a desirable ratio being 2:1. The arrangement also includes a tensioning device for the bead chain drive. The tensioning device includes a resilient strip 25 affixed to housing 11 of tuning unit 10 and having an end portion 25*a* bearing against the bead chain 22.

A second actuator knob 26 is affixed to the auxiliary drive shaft 21 and is mounted in nested relation with the first actuator knob 18. In this manner, actuator knob 18 can be rotated to rotate drive shaft 13 between successive detents and selectively set tuning unit 10 to various signal channels, these channels being indicated by the calibrations on the indicator portion 19 of actuator knob 18; and actuator knob 26 may be rotated independently of actuator knob 18 to rotate the auxiliary drive shaft 21 and, therefore, the main drive shaft 15 of tuning unit 14 at a selected speed. A fine tuning element 27 for tuning unit 10 is mounted on the auxiliary drive shaft 21, so that fine tuning can be achieved for tuning unit 10 by actuation of knob 26 when the second tuning unit 14 is not in use.

Tuning unit 14 has an auxiliary indicator shaft 28 rotatably mounted thereon by means of a pair of brackets 29 and 30. Shaft 28 extends from one end of the second tuning unit to the other between shafts 13 and 15 and in spaced parallel relation therewith. Shaft 28 has a pinion 31 affixed to one end thereof and which is coupled through idler gear 32 and gear 33 to drive shaft 15, the latter gear being affixed to sprocket wheel 24. In this manner, rotation of main drive shaft 15 of the second tuning unit 14 causes the auxiliary indicator shaft 28 to rotate at a selected decreased speed with respect to the rotation of shaft 15. Shaft 15 is threaded and rotation of this shaft causes carriage 42 to move longitudinally which, in turn, moves tuning shafts 43, 44 to vary the tuning of unit 14. Carriage 42 is conveniently supported by shaft 28 slidable along the latter shaft.

Main drive shaft 13 has a main indicator drive shaft 34 rotatably mounted thereon and in coaxial relation therewith. Drive shaft 34 has a sprocket wheel 35 affixed thereto which is coupled to a sprocket wheel 36 affixed to shaft 28 through a bead chain 37. Sprocket wheel 35 is spaced from housing 11 of tuning unit 10 and the front panel 17 of chassis 12 is in alignment with sprocket wheel 36 by a pair of coaxial sleeves 38 and 39 on the main driving shaft 13. Sprocket wheel 35 is driven by chain 37 at a predetermined speed with respect to shaft 15 of the second tuning unit.

An indicating knob 40 is affixed to the main indicator drive shaft 34 and is mounted in nested relation with the indicating portion 19 of actuator knob 18. Indicator knob 40 is preferably formed of a translucent plastic and is suitably calibrated, its calibrations being viewed through the viewing section 20 in the indicator portion 19 of actuator knob 18.

The tuning assembly is usually arranged so that only one calibration of the indicator portion 19 can be viewed from the top at a time, with such calibration designating the particular channel in the very high frequency band to which the tuner 10 is adjusted. When ultra-high frequency tuning is desired, it is merely necessary to turn actuator knob 18 until the calibrations on indicator knob 40 may be viewed through viewing section 20 in the indicator portion 19. The receiver is then tuned through the ultra-high frequency band by turning actuator knob 26 which drives main drive shaft 15 of tuner unit 14 at a selected proportional speed as previously described. The rotation of main drive shaft 15 causes the auxiliary indicator drive shaft 28 to rotate which, in turn, drives the main indicator drive shaft 34. Rotation of the main indicator drive shaft causes the indicator knob 40 to rotate with its various calibrations viewable through viewing section 20 and indicating the various signal channels in the ultra-high frequency band to which the tuning unit 14 is successively adjusted.

Gear 31 may be disengaged from gear 32 for calibrating purposes merely by moving gear 31 and shaft 28 to the left of the drawing against biasing spring 45. This allows indicating knob 40 to be set to a desired calibration corresponding to a particular position of carriage 42. Gear 31 may then be released and forced into engagement with gear 32 by spring 45 with knob 40 in the desired calibrated position.

As previously noted for the calibrated positions of the actuator knob 18, tuning unit 10 is actuated and the tuning unit 14 is not in use. Under these conditions, adjustment of actuator knob 26 provides fine tuning for the tuner 10 in each of the various signal channels to which that tuner unit is adjusted.

It is usual practice to provide an indicator lamp within the indicator portion 19 of actuator knob 18 to illuminate the various calibrations and indicate the signal channels in the very high frequency band. With the arrangement of the present invention, the same indicator lamp can be used for both the very high and ultra high frequency bands by mounting the lamp within the indicator knob 40. In this manner, the lamp illuminates the calibrations on indicator portion 19 when the tuning unit 10 is being adjusted, and it illuminates the calibrations on indicator knob 40 through aperture 20 when tuning unit 14 is being adjusted.

Under some circumstances, it is desirable that the bead chain drive 22 replaced by a string drive so that actuation of the auxiliary drive shaft 21 beyond the end positions of the tuning unit 14 results merely in slippage of the drive and precludes any possibility of damaging the tuning unit.

Under these circumstances, the bead chain drive between shafts 28 and 34 maintains the proper relation between indicator knob 40 and drive shaft 15, despite such slippage.

The present invention provides, therefore, an improved tuner assembly in which the tuning control for the very high and ultra high frequency tuner units operates in an efficient manner and occupies a relatively small space, and in which the actuator and indicator knobs for the arrangement are conveniently mounted in nested relation in the manner described, also to minimize the space requirements and aid in the facility with which the assembly can be operated.

While a particular embodiment of the invention has been shown and described, modifications may be made and it is intended in the appended claims to cover all such modifications as fall within the true spirit and scope of the invention.

I claim:

1. A tuner assembly for a television receiver or the like including in combination, a first tuning unit having front and back ends, a drive shaft for said first unit extending from the front end thereof, a first indicator knob affixed to the end of said shaft remote from said first tuning unit and having a viewing aperture therein, a second tuning unit having front and back ends, said second tuning unit being mounted adjacent said first tuning unit, a main drive shaft for said second unit extending from the back end thereof, an auxiliary drive shaft for said second unit rotatably mounted within said drive shaft of said first unit and having a portion extending through the back end of said first unit, means for coupling said portion of said auxiliary drive shaft to said main drive shaft of said second unit to establish a driving connection to said second unit, an indicator drive shaft rotatably mounted on said drive shaft of said first unit in coaxial relation therewith, a second indicator knob mounted on said indicator drive shaft and nested within said first indicator knob to be viewable through the aforesaid aperture in said first indicator knob, and means for coupling said main drive shaft of said second tuning unit to said indicator drive shaft to establish a driving connection from said second unit to said second indicator knob.

2. A tuner assembly for a television receiver or the like including in combination, a first tuning unit for tuning the receiver through a first frequency band and a second tuning unit for tuning the receiver through a second frequency band, a drive shaft for said first tuning unit, a first indicator knob mounted on said drive shaft having calibrations thereon designating respective signal channels in the first frequency band, a drive shaft for said second tuning unit rotatably mounted coaxially within said first mentioned drive shaft, and a second indicator knob coupled to said drive shaft for said second tuning unit and nested within said first calibrated indicator knob, said second indicator knob having calibrations thereon designating respective signal channels in the second frequency band, said first indicator knob having a viewing section therein disposed over the calibrations of said second knob for selectively revealing such calibrations, with the calibrations on said second indicator knob being viewable only through said viewing section in said first indicator knob and when said first indicator knob is in a selected position.

3. A tuner assembly for a television receiver or the like including in combination, a first tuning unit for tuning the receiver through a first frequency band and a second tuning unit for tuning the receiver through a second frequency band, a drive shaft for said first tuning unit, a first actuator knob affixed to said drive shaft and having an annular indicator portion having calibrations thereon designating respective signal channels in the first frequency band, a drive shaft for said second tuning unit rotatably mounted coaxially with said first mentioned drive shaft, a second actuator knob affixed to said drive shaft for said second tuning unit and mounted in nested relation with said first actuator knob, and an indicator knob coupled to said drive shaft for said second tuning unit and nested within said indicator portion of said first actuator knob, said indicator knob having calibrations thereon designating respective signal channels in the second frequency band, said indicator portion of said first actuator knob having a viewing section disposed over the calibrations of said indicator knob for selectively revealing such calibrations, with the calibrations on said indicator knob being viewable only through said viewing aperture in said indicator portion of said first actuator knob and when said first actuator knob is in a selected position.

4. A tuner assembly for a television receiver or the like including in combination, a first tuning unit and a second tuning nuit, a drive shaft for said first tuning unit, a first actuator knob affixed to said drive shaft and having an annular calibrated indicator portion with a viewing aperture therein, a drive shaft for said second tuning unit rotatably mounted coaxially within said first mentioned drive shaft, a second actuator knob affixed to said drive shaft for said second tuning unit and mounted in nested relation with said first actuator knob, an indicator drive shaft rotatably mounted on said first mentioned drive shaft in coaxial relation therewith, a calibrated indicator knob affixed to said indicator drive shaft and nested within said indicator portion of said first actuator knob with the calibrations on said indicator knob viewable through said viewing aperture in said indicator portion of said first actuator knob, and means for coupling said indicator drive shaft to said second tuning unit to establish a mechanical drive from said second unit to said calibrated indicator knob.

5. A tuner assembly for a television receiver or the like including in combination, a first tuning unit and a second tuning unit, a drive shaft for said first tuning unit and a main drive shaft for said second tuning unit, a first actuator knob affixed to said first mentioned drive shaft and having an annular calibrated indicator portion with a viewing aperture therein, an auxiliary drive shaft for said second tuning unit rotatably mounted coaxially within said first mentioned drive shaft, a second actuator knob affixed to said auxiliary drive shaft and mounted in nested relation with said first actuator knob, a chain drive mechanically coupling said auxiliary drive shaft to said main drive shaft of said second tuning unit, a main indicator drive shaft rotatably mounted on said first mentioned drive shaft in coaxial relation therewith, a calibrated indicator knob affixed to said indicator drive shaft and nested within said indicator portion of said first actuator knob with the calibrations on said indicator knob viewable through said viewing aperture in said indicator portion of said first actuator knob, an auxiliary indicator drive shaft mechanically coupled to said main drive shaft for said second tuning unit, and a chain drive mechanically coupling said auxiliary indicator drive shaft to said main indicator drive shaft.

6. A tuner assembly for a television receiver or the like including in combination, a first tuning unit and a second tuning unit, a main drive shaft for said first tuning unit, a first actuator knob affixed to said main drive shaft and having an annular calibrated indicator portion with a viewing aperture therein, a fine tuning drive shaft for said first tuning unit mounted coaxially within said main drive shaft, a second actuator knob affixed to said fine tuning drive shaft and mounted in nested relation with said first actuator knob, a main drive shaft for said second tuning unit, means for mechanically coupling said fine tuning drive shaft to said main drive shaft of said second unit, a main indicator drive shaft rotatably mounted on said main drive shaft of said first tuning unit in coaxial relation therewith, a calibrated indicator knob for said second tuning unit affixed to said indicator drive shaft and nested within said indicator portion of said first actuator knob with the calibrations on said indicator knob viewable through said viewing aperture in said indicator portion of said first actuator knob, an auxiliary indicator drive shaft mechanically coupled to said main drive shaft of said second tuning unit, and a bead chain drive coupling said auxiliary indicator drive shaft to said main indicator drive shaft.

7. A tuner assembly for a television receiver or the like including in combination, a first tuning unit and a second tuning unit, a main drive shaft for said first tuning unit, an auxiliary drive shaft for said second tuning unit mounted coaxially with said drive shaft for said first unit, a main drive shaft for said second unit, means for mechanically coupling said auxiliary drive shaft to said main drive shaft of said second unit, an indicator drive shaft mounted coaxially with said main drive shaft of said first unit, and means for coupling said main drive shaft of said second unit to said indicator drive shaft.

8. A tuner assembly for a television receiver or the like including in combination, a first tuning unit and a second tuning unit, a main drive shaft for said first tuning unit, an auxiliary drive shaft for said second tuning unit mounted coaxially within said main drive shaft for said first unit, a main drive shaft for said second unit mounted in spaced parallel relation with said main drive shaft for said first unit, means for mechanically coupling said auxiliary drive shaft to said main drive shaft of said second unit, an indicator drive shaft mounted coaxially on said main drive shaft of said first unit, and means for coupling said main drive shaft of said second unit to said indicator drive shaft.

9. A tuner assembly for a television receiver or the like including in combination, a first tuning unit and a second tuning unit, a main drive shaft for said first tuning unit, a fine tuning drive shaft for said first tuning unit mounted coaxially within said main drive shaft, a main drive shaft for said second unit mounted in spaced parallel relation with said main drive shaft for said first unit, a bead chain drive coupling said fine tuning drive shaft to said main drive shaft of said second unit, a main indicator drive shaft mounted coaxially on said main drive shaft of said first unit, an auxiliary indicator drive shaft mounted in spaced parallel relation to said main drive shaft of said first unit, a pinion drive coupling said auxiliary indicator drive shaft to said main drive shaft of said second unit, and a bead chain drive coupling said auxiliary indicator drive shaft to said main indicator drive shaft.

10. A tuner assembly for a wave signal receiver including in combination, a first tuning unit, a second tuning unit, a first drive shaft for said first tuning unit, a first actuator knob affixed to said first drive shaft and having an annular calibrated indicator portion with a viewing aperture therein, a second drive shaft for said second tuning unit rotatably mounted coaxially with said first drive shaft, with one of said first and second drive shafts being tubular and the other drive shaft having a portion extending therein, a second actuator knob affixed to said second drive shaft and mounted in nested relation with said first actuator knob, an indicator drive shaft rotatably mounted about said first and second drive shafts in coaxial relation therewith, a calibrated indicator knob affixed to said indicator drive shaft and nested within said indicator portion of said first actuator knob with the calibrations on said indicator knob viewable through said viewing aperture in said indicator portion of said first actuator knob, and means for coupling said indicator drive shaft to said second tuning unit to establish a mechanical drive from said second unit to said calibrated indicator knob.

References Cited in the file of this patent

UNITED STATES PATENTS

| | | |
|---|---|---|
| 1,631,453 | Aspden | June 7, 1927 |
| 2,456,949 | Keim | Dec. 21, 1948 |
| 2,572,023 | Goodwin | Oct. 23, 1951 |